United States Patent [19]

Goldstein et al.

[11] 3,961,241
[45] June 1, 1976

[54] EMISSION TESTING CIRCUIT FOR COLOR CATHODE RAY TUBES

[75] Inventors: Richard Goldstein, Deerfield; Harold Feldman, Skokie, both of Ill.

[73] Assignee: Dynascan Corporation, Chicago, Ill.

[22] Filed: Apr. 30, 1975

[21] Appl. No.: 573,370

[52] U.S. Cl. .................... 324/20 CR; 178/DIG. 36; 358/10
[51] Int. Cl.² ...................................... G01R 31/024
[58] Field of Search ................ 358/10; 178/DIG. 36, 178/DIG. 37; 316/27; 324/20 CR, 24–26

[56] References Cited
UNITED STATES PATENTS

| | | | |
|---|---|---|---|
| 3,309,459 | 3/1967 | Donigian | 324/20 CR |
| 3,688,184 | 8/1972 | Baum | 324/20 CR |
| 3,915,533 | 10/1975 | Kozicki | 324/25 |

Primary Examiner—R. V. Rolinec
Assistant Examiner—Michael J. Tokar
Attroney, Agent, or Firm—Wallenstein, Spangenberg Hattis & Strampel

[57] ABSTRACT

The emission of the various electron guns of a color cathode ray tube are measured and indicated by a time sharing multiplexing technique where emission generating voltages are fed to the electrodes of the various electron guns in rapidly repeated sequence and the degree of emission thereof is displayed simultaneously on the faces of current meters responsive to average current flow. Such a technique permits simultaneous display of emission current for in-line cathode ray tubes having commonly connected control and/or accelerator electrodes, where individually adjustable spot cut-off voltages are sequentially connected to the set of commonly connected electrodes involved in synchronism at any given instant with the connections of the cathode electrode thereto which is to be assigned to the adjustable voltage involved.

12 Claims, 12 Drawing Figures

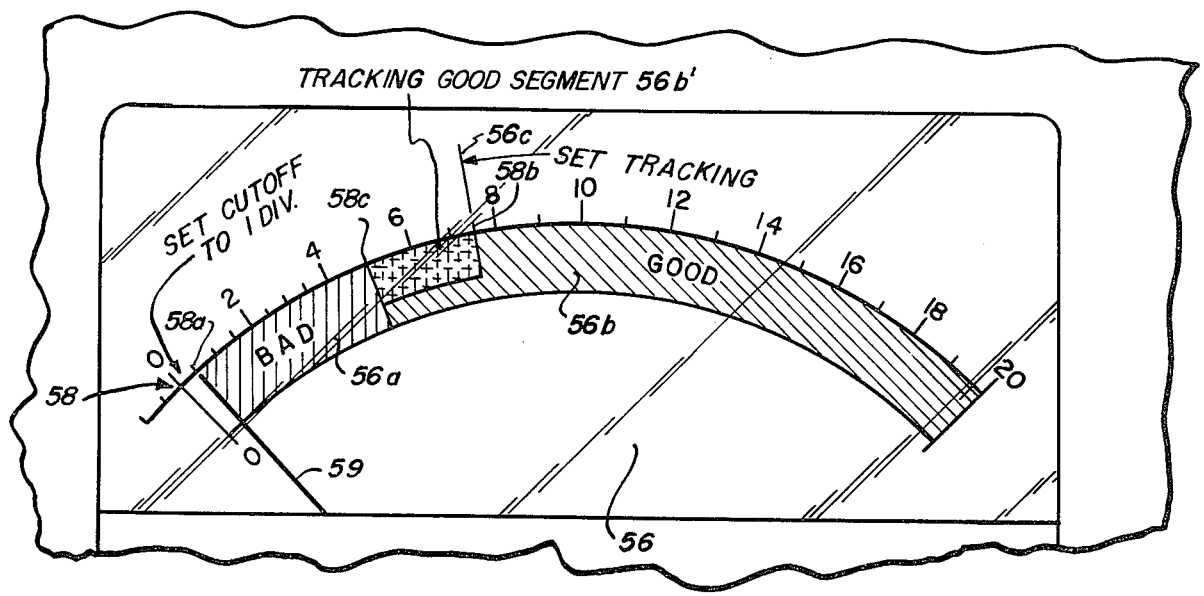
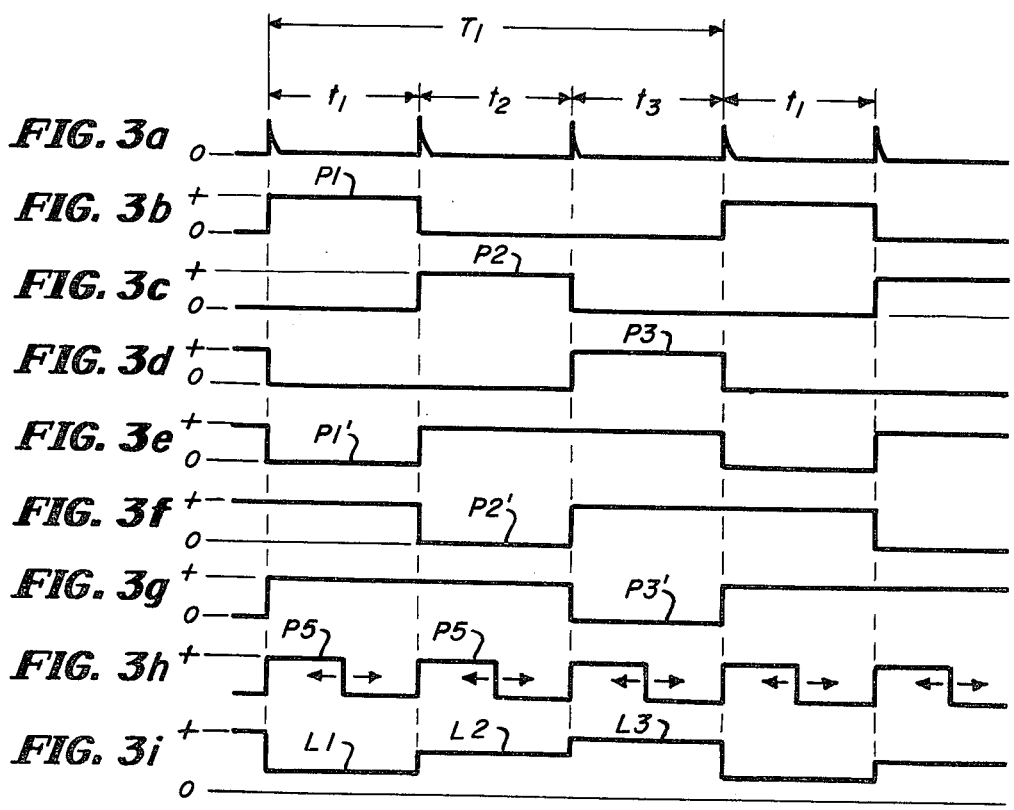

EMISSION TESTING CIRCUIT FOR COLOR CATHODE RAY TUBES

BACKGROUND OF INVENTION

This invention relates to electron gun emission testing equipment for color cathode ray tubes.

Properly operating electron guns of a color cathode ray tube should operate at adequate individual and relative emission levels. The electron guns must operate at proper relative emission levels to ensure a proper gray scale for a black and white picture producing video signal which would otherwise produce a colored tint if the relative emission strengths of the electron guns do not fall within an acceptable range of values. To this end the ratio between the highest and lowest emitting electron gun of a color cathode ray tube under voltage conditions producing a bright white indication must not be greater than 1.5 to pass the relative emission test under present standards.

In carrying out an emission test, commonly a fixed predetermined negative bias voltage is first applied between each control electrode and associated cathode electrode and an adjustable positive voltage is applied between each accelerator electrode and the associated cathode electrode and adjusted to a value so current flow between the cathode and accelerator electrodes indicated on a current meter just begins to flow, to produce what is called a spot cutoff emission level. The various electron guns generally require different positive voltage levels between the accelerator and cathode electrodes to produce a spot emission cutoff level. (Negative voltages applied between the control and cathode electrodes can be the individually adjustable spot emission cutoff obtaining voltages, but this is not a convenient way to test the emission current.) The voltage on each control electrode is then switched to a value like chassis ground, which does not affect the previously adjusted accelerator to cathode voltage, to provide a high emission level which would produce a bright white intensity on the face of the cathode ray tube under normal operating conditions. (Under emission test conditions, there is no voltage applied to the screen of the cathode ray tube.) The control and accelerator electrode voltages are generally fed to the electron guns by manually operable switches which feed the voltages involved to the electron guns in a sequence selected by the operator. The operator notes the relative maximum emission values during the various measurements and computes the ratio of the emission levels of the highest and lowest emitting guns to see if the ratio exceeds an acceptable 1.5 to 1 value. In some emission testing equipment, a separate current meter is provided for each electron gun so that the emission of all of the electron guns can be simultaneously measured and indicated, making it an easier matter to determine the emission ratio of the electron guns. However, it is extremely difficult to design emission testing equipment which provides for simultaneous emission of all of the electron guns of all types of cathode ray tubes, including the recently developed "in-line" cathode ray tubes which have commonly connected control and/or accelerator electrodes. The difficulty is caused by the problem of isolating the spot emission cutoff level voltage adjusting circuits connected between commonly connected accelerator electrodes and the individual cathodes of the electron guns from the circuit which applies the initial negative reference voltage and the high intensity emission producing voltage between commonly connected control electrodes and the cathodes. (Obviously, the switching of the commonly connected control electrodes from an initial reference level to a high intensity producing level should not effect the voltages coupled between the commonly connected accelerator electrodes and the individual cathode electrodes.)

In prior emission testing techniques which simultaneously measure the emission of all of the electron guns, the simultaneous flow of emission current from the three electron guns require relatively expensive well regulated power supplies to avoid substantial variations of the voltages fed to the accelerator electrodes when the control electrode voltage is switched to a bright white intensity producing value. Another disadvantage of prior emission measuring techniques in using sequential manual switching is the accompanying time delay involved for making the test, including the waiting time for permitting the emission of an electron gun to stabilize. Furthermore, less than desirable accuracy is achieved in obtaining relative emission measurements where the electron guns are made successively operable by manual switching techniques, since the separately operating electron guns do not duplicate or nearly approximate actual operating conditions and interactions between operating electron guns and the possibility of intermittent operating conditions are not then taken into account.

SUMMARY OF INVENTION

In accordance with one of the features of the present invention, substantially simultaneous measurement and indication of the emission of the electron guns of a color cathode ray tube is achieved in a unique way, by automatically switching the voltages between the cathode and accelerator electrodes of the electron guns of a cathode ray tube so that emission of the electron guns are sequentially established. In such case, the current flowing at any given instant is no greater than the emission required for a single electron gun, which reduces by a factor of at least ⅔ the current supplying requirements of a power supply which supplies only the emission current. Such a power supply can thus be a relatively inexpensive regulated power supply. A separate current meter is preferably connected in the path of emission current flow for each electron gun, each of which meters most advantageously has a movement which stabilizes at the average current value of the emission current involved, which preferably constitutes current pulsations at a pulse repetition rate occurring many times per second. The present invention thus provides steady simultaneous indications of the flow of emission current in all of the electron guns under conditions roughly approximating normal operating conditions when all electron guns are operating at the same time.

Unlike the prior art, the emission test equipment of the invention provides a substantially simultaneous measurement and indication of emission current for all types of cathode ray tubes including "in-line" cathode ray tubes where one or more of the electrodes of the separate electron guns are connected together. In such case, the most severe requirement for the equipment is present where the individually adjustable spot emission cutoff level producing voltages are to be connected to the commonly connected electrodes of the electron guns. This requirement poses no problem in this equipment because individually adjustable voltages to be coupled to the commonly connected electrodes are switched in synchronism with switching of the cathode electrodes of the electron guns. In using the emission test equipment of the preferred form of the invention designed for use with both in-line and non-in-line cathode ray tubes, the spot emission cutoff current levels of the electron guns are obtained preferably by first connecting a reference negative potential between the control and cathode electrodes of all of the electron guns, while the individually adjustable voltages, sequentially coupled between the accelerator and associated cathode electrodes preferably in rapid sequence, are adjusted to provide emission current levels at or slightly above their cutoff points. Then, the control electrode voltage is switched to a reference level, such as chassis ground, which establishes emission levels which would produce a bright white indication on the face of a normal operating cathode ray tube. A measurement of the large emission currents which flow through the various sequentially switched accelerator and cathode electrode circuits then indicates the relative emission strengths of the three electron guns. If the emission level of any particular electron gun does not meet minimum requirements, a rejuvenation operation can be carried out using known rejuvenation techniques.

The above and other advantages and features of the present invention will become more apparent by making reference to the specification to follow with drawings and the claims.

DESCRIPTION OF DRAWINGS

FIG. 2 is a fragmentary view of the face of the emission testing meters preferably used in the exemplary form of the invention of FIG. 1;

FIGS. 3a, 3b, 3c, 3d, 3e, 3f, 3g, 3h and 3i respectively show on a common time base waveforms of the voltages appearing in various portions of the circuit in FIGS. 1 and 3.

DESCRIPTION OF EXEMPLARY EMBODIMENT OF INVENTION

Figure 1:
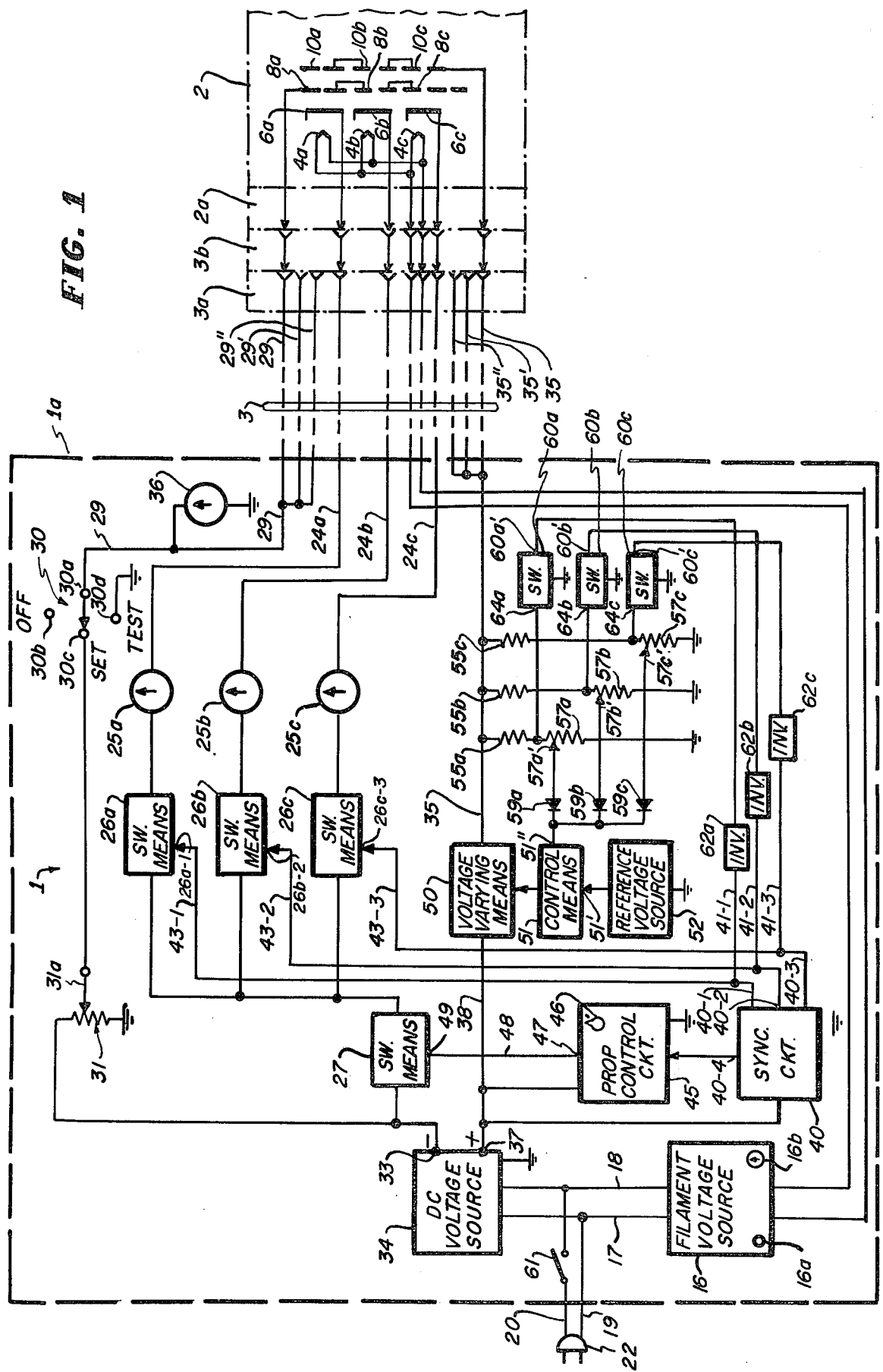
FIG. 1 is a block diagram of a preferred emission testing circuit including features of the present invention.

In the drawing there is shown a cathode ray tube emission testing circuit 1 which will generally constitute part of a greater overall circuit (not shown) used to test the various characteristics of a cathode ray tube. (For example, such equipment commonly performs leakage, life and focus tests in addition to a cathode rejuvenation operation.) This overall circuitry is generally contained within a housing identified by a dashed line 1a having various meters and controls on the outer face thereof, some of which are shown as part of the circuit 1 to be described. There is generally extending from the housing of the cathode ray tube test and rejuvenating unit a cable 3 having on the end thereof a socket connector 3a having generally up to 12 socket terminals and associated conductors extending to various parts of the cathode ray tube test and rejuvenating circuitry necessary to carry out the various test and rejuvenating operations involved. Since the plug connectors of cathode ray tubes of different design have a variety of configurations, it is necessary to provide a set of removable plug-in adapters, like unit 3b, which are each removably insertable into the socket terminals of the socket connector 3a so that the plug connectors like 2a at the bases of the various types of cathode ray tubes can be connected to the appropriate points in the emission testing circuit 1.

FIG. 1 shows a color cathode ray tube 2 having the usual three electron guns respectively including heater filaments 4a, 4b and 4c, surrounding cathode electrodes 6a, 6b and 6c with apertures aligned with the ends of the associated cathode electrodes, control electrodes 8a, 8b and 8c with respective apertures aligned with the apertures of the associated control electrodes, and accelerator electrodes 10a, 10b and 10c with their apertures aligned with the apertures of the associated control electrodes. The cathode ray tube 2 illustrated is of the "in-line" type wherein the various control electrodes 8a, 8b and 8c are electrically connected together and the accelerator electrodes 10a, 10b and 10c are electrically connected together within the cathode ray tube.

The heater filaments 4a, 4b and 4c are shown connected in parallel within the cathode ray tube and connected through the various plug and socket terminals of the plug connector 2a at the base of the cathode ray tube, the adapter unit 3b and the cable socket connector 3a to conductors 12 and 14 extending to the output of a filament voltage source shown in block form and identified by reference numeral 16. The filament voltage source 16 is shown connected by conductors 17 and 18 to conductors 19 and 20 extending from a conventional plug connector 22 adapted to be plugged into an AC outlet socket. The filament voltage source 16 may be a circuit including a manually operable control member 16a for adjusting a variac or transformer tap-off connecting switch (not shown) for varying the magnitude of an AC voltage appearing on the conductors 12 and 14. A voltmeter 16 indicating the magnitude of this voltage is coupled across the conductors 12 and 14. The control member 16a is adjusted so that the rated voltage of the cathode ray tube filaments appears across the conductors 12 and 14 extending to the heater filaments of the selected cathode ray tube under test.

The cathode electrodes 6a, 6b and 6c are connected through the various plug and socket terminals of the cathode ray tube plug connector 2a, the adapter unit 3b and the cable socket connector 3a to respective conductors 24a, 24b and 24c. The conductors 24a, 24b and 24c are connected through respective emission current indicating meters 25a, 25b and 25c, switch means 26a, 26b and 26c and a common switch means 27 to chassis ground 28.

The commonly connected control electrodes 8a, 8b and 8c are connected through the plug and socket terminals of the cathode ray tube plug connector 2a, adapter unit 3b and cable socket connector 3a to a conductor 29 connected to the wiper 30a of a manually operable switch 30. The switch 30 is a function selector switch having a number of stationary contacts of which stationary OFF contact 30b, SET contact 30c and TEST contact 30d are illustrated. The stationary OFF contact 30c is connected to the wiper 31a of a voltage adjusting potentiometer 31 and the TEST stationary contact 30d is connected to chassis ground. One end of the voltage adjusting potentiometer 31 is shown connected to chassis ground and the other end is coupled by a conductor 32 to the negative DC voltage terminal 33 of the DC voltage source 34 energized from AC input conductors 19 and 20. The DC voltage source 32 may include various rectifiers, transformers and the like for providing a desired negative voltage with respect to chassis ground at the terminal 33. The wiper 31a of the potentiometer 31 is adjusted to a desired reference negative voltage for carrying out the emission test on the particular cathode ray tube involved. A voltmeter 36 is shown connected between the conductor 29 and chassis ground to indicate the output voltage of the potentiometer 31 fed to the control electrodes of the cathode ray tube 2.

In the case where the cathode ray tube 2 is one wherein the control electrodes are separate rather than connected together within the cathode ray tube, these various control electrodes can be coupled through various plug connections on the base of the cathode ray tube, an adapter unit different from 3b shown in the drawing, and cable socket connector 3a to the conductor 29. (The socket terminals of connector 3a for making these connections are shown in the drawing together with their associated conductors 29' and 29" connected to conductor 29.) Accordingly, when the wiper 30a is connected to the stationary SET contact 30c, a selective negative control voltage is fed to the control electrodes of the cathode ray tube involved.

When the wiper 30a is connected to the TEST contact 30d, the wiper is coupled to chassis ground which will feed reference chassis ground potential to the control electrodes of the cathode ray tube, which generally produces a bright white trace producing emission of the electron guns involved.

The commonly connected accelerator electrodes 10a, 10b and 10c are coupled through the various plug and socket terminals of the cathode ray tube plug connector 2a, adapter unit 3b and the cable socket connector 3a to conductor 35 extending to a circuit now to be described, which at any instant feeds one of three manually adjustable voltages to the accelerator electrode to be associated with the electron gun which is to be rendered operative at the instant involved. In the example of the present invention shown, automatically and in rapid fire cyclically repeating sequence the various cathode emission circuits of the electron guns are rendered operative in synchronism with the feeding of three individually adjustable voltages to the commonly connected accelerator electrodes.

The cable socket connector 3a is adapted to be operative with cathode ray tubes having separate as well as commonly connected accelerator electrodes and, to this end, is provided with socket terminals and associated conductors 35' and 35" which extend to the aforesaid conductor 35.

The adjustable voltage circuit now to be described obtains it energizing voltage from a voltage terminal 37 of the DC voltage source 34. A bus 38 is shown connected to the terminal 37, and a conductor 39 extends from this bus 38 to a synchronizing circuit 40 to be described in more detail hereinafter, which circuit is operative to generate various timing and control voltage waveforms shown in FIGS. 3a through 3i. Suffice it to say at this point, in the exemplary form of the invention being described, the synchronizing circuit produces preferably square positive and/or negative going control pulses like pulses P1-P2-P3 and P1'-P2'-P3' shown in FIGS. 3b, 3c, 3d, 3e, 3f and 3g respectively occurring during successive equal time segments t1, t2 and t3 (FIG. 3a) of a basic repeating time period T1. These control pulses are used as gate opening or switch closing control signals.

The synchronizing circuit 40 has three output terminals 40-1, 40-2 and 40-3 at which positive going control pulses P1, P2 and P3 respectively appear at the relative timing shown in FIGS. 3b, 3c and 3d. Timing control lines 43-1, 43-2 and 43-3 are respectively coupled to the aforementioned synchronizing circuit output terminals 40-1, 40-2 and 40-3 and respectively extend to control input terminals 26a-1, 26b-2 and 26c-3 of the aforementioned switch means 26a, 26b and 26c associated with the cathode circuits of the color cathode ray tube 2. The switch means 26a, 26b and 26c, which may be transistors, become closed by the control pulses P1, P2 and P3 only for the duration thereof.

The synchronizing circuit 40 has a clock pulse output terminal 40-4 at which narrow clock pulses P4 as shown in FIG. 3a appear. The clock pulses P4 occur at the beginning of each of the time segments t1, t2 and 53, etc. There are thus three clock pulses per period T1 during which the control pulses P1, P2 and P3 are sequentially fed to the three electron guns of the cathode ray tube 2. The clock pulses at the output terminal 40-4 of the synchronizing circuit 40 are fed to a proportional control circuit 45 which initiates the generation of variable width pules P5 shown in FIG. 3e. The pulses P5 have identical widths which are adjusted by a manually operable control member 46. The proportional control circuit 45 may be a one-shot multivibrator of conventional design.

The variable pulse width output of the proportional control circuit 45 appears at an output terminal 47 which is connected to a control line 48 extending to the control terminal 49 of the switch means 27 connected in common with the switch means 26a, 26b and 26c. Each pulse P5 from the output of the proportional control circuit 45 closes the switch means 27 to couple chassis ground through the switch means 26a, 26b or 26c closed at the same time. It is thus apparent that by varying the width of the pulses P5, the duration during which electron gun emission current flows proportionately varies. (This part of the circuit is a sole invention of Gus Rose and is the subject of a co-pending patent application which is being filed on the same date as the present application.) This feature of the circuit is utilized to providing an indication on the faces of the current meters 25a, 25b and 25c in a manner to be described, which immediately indicates whether or not the relative magnitudes of the highest and lowest emitting electron guns fall within an acceptable 1½ to 1 ratio for reasons previously explained.

The circuit for supplying the positive voltage to the accelerator electrodes is uniquely a voltage regulator circuit coupled between the positive bus 38 extending the DC voltage source 34 and the aforementioned conductor 35 which is coupled through the various connectors 3a, 3b and 2a to the accelerator electrodes 10a, 10b and 10c. This voltage regulator circuit provides three adjustable voltages which are sequentially coupled to the conductor 35 in synchronism with the operation of the switch means 26a, 26b and 26c, so that the appropriate adjustable voltage is applied to the selected gun in a manner to be described. The DC voltage source 34 is the main source for DC current of the entire circuit shown and it would materially add to the cost of the manufacture of the test equipment if this DC voltage source would be a regulated DC voltage source. If the DC voltage source 34 is not a regulated voltage source, the output thereof can fluctuate with variation in line voltage and with the current supplied therefrom. It is one of the unique features of the present invention to provide a separate voltage regulator circuit for only the circuit supply voltage to the accelerator electrodes and which, in the preferred form of the invention, is designed to operate for variations in emission current flow from zero to the average current which flows between the cathode and accelerator electrodes of the cathode ray tube during the sequential switching means of the different levels of output voltage of the voltage regulator circuit. (To produce simultaneous meter indications of emission current flow if all electron guns were to be continuously operative to supply such current flow, the current requirements for the voltage regulator circuit now to be described would be three times that necessary when the electron guns are sequentially rendered operative, as previously explained.)

The voltage regulator circuit includes a voltage varying means 50 connected between the positive bus 38 and the conductor 35 connected with the accelerator electrodes of the cathode ray tube 2. The voltage varying means could be a power resistor where a shunt regulator circuit is utilized or a variable resistance device like a transistor where a series regulator circuit is utilized. Associated with variable voltage means 50 is a control means 51 which, in accordance with well known series or shunt regulating techniques, responds to the output of a source of reference voltage 52 and a voltage derived from the voltage at the output of the voltage varying means to provide a stabilized voltage on the conductor 35 independently of input voltage and current flow variations over given limits. Thus, the source of reference voltage 52 is shown connected to an input 51' of the control means 51 and a voltage derived from the output conductor 35 is coupled to the control means 51 at an input terminal 51'' thereof.

Three different manually adjustable voltages are most advantageously sequentially fed to the input terminal 51'' of the control means 51. These adjustable voltages are obtained in the most preferred form of the invention in the manner illustrated. Thus, three circuit branches extend between the conductor 35 and chassis ground, which branches respectively include fixed resistors 55a, 55b and 55c in series with potentiometers 57a, 57b and 57c. The wipers 57a', 57b' and 57c' of the potentiometers 57a, 57b and 57c are respectively connected to the input terminal 51'' of the control means 51 through isolating rectifiers 59a, 59b and 59c. Only one of the branch circuits is rendered operative at any given time to couple voltage from the wiper of the associated potentiometer by a switching circuit comprising switch means 60a, 60b and 60c. When closed, switch means 60a, 60b or 60c applies chassis ground to the junction between the associated resistors 55a, 55b or 55c and the potentiometers 57a, 57b or 57c. The switch means 60a, 60b and 60c can be closed by the feeding of a positive control voltage through control input terminals 60a', 60b' and 60c', the voltages being obtained respectively from the output of inverters 62a, 62b and 62c, whose inputs extend to the timing lines 43-1, 43-2 and 43-3 at which the positive pulses P1, P2 and P3 of FIGS. 3b, 3c and 3d appear. The inverters 62a, 62b and 62c respectively invert the positive going pulses P1, P2 and P3 to negative going pulses P1', P2' and P3' shown in FIGS. 3e, 3f and 3g. These negative going pulses decrease from a normal positive level to chassis ground. Thus, at any one time two of the switch means 60a, 60b and 60c are closed by the positive portions of the waveform shown in FIGS. 3e, 3f and 3g, and one of the switch means is opened by the presence of a negative going pulse P1', P2' or P3'. Switch means 60a, 60b and 60c are, accordingly, closed in sequence in synchronism with the closing of switch means 26a, 26b and 26c which sequentially connects chassis ground potential to the cathode electrodes 6a, 6b and 6c of the cathode ray tube 2. With the orientation of the rectifiers 59a, 59b and 59c illustrated, the rectifiers associated with the potentiometers which are being grounded by the closure of the associated switch means 60a or 60b are back-biased into non-conduction by the voltage coupled to input terminal 51' of the control means 51 by the rectifier associated with one switch means which remains open.

By varying the position of the wiper of any potentiometer, the voltage at the output of the voltage varying means 50 to which the conductor 35 extends will vary proportionately, so that three different voltage levels are established in sequence on the conductor 35 by the switching system shown. FIG. 3i shows these three different voltage levels L1, L2 and L3 which may be present on the conductor 35 in the time segments illustrated. If the voltage on the conductor 35 during a given time segment t1, t2 and t3 tends to go up or down, in accordance with conventional voltage regulator action, the control means 51 will operate in a way which stabilizes the voltage on the conductor 35. Whether or not an electron gun is operating properly is determined by the measurement shown on the associated current meters 25a, 25b or 25c which, in turn, is directly related to the provision of a stable voltage on the conductor 35. To achieve such stability in the emission testing circuits of the prior art, where all electron guns are simultaneously continuously operative to provide simultaneous emission indications, required three expensive bleeder resistors or three series or shunt regulator circuits to provide the three separately adjustable accelerator voltages. The three regulator circuits were not utilized because of their prohibitive cost. The use of three bleeder resistors is relatively costly, gives less than ideal voltage regulation and is wasteful of power. In the present invention, simultaneous indications of emission current flow is obtained with the near ideal voltage regulation provided by only a single series or shunt regulator circuit requiring relatively little power and operating with only ⅓ of the current requirements of a circuit which must carry emission current simultaneously and continuously flowing in three electron guns, as in the case of prior emission testing circuits providing simultaneous emission indications.

Before describing the manner in which the emission measuring circuit of FIG. 1 is utilized, it would be helpful first to examine the face of an exemplary meter preferably utilized for each of the meters 25a, 25b and 25c. Thus, as shown in FIG. 2, each of the meters 25a, 25b and 25c has a meter face 56 with an annular band divided into a BAD segment 56a (which may be colored red), a GOOD band segment 56b which may be colored green, and a TRACKING GOOD segment 56b' at the left corner portion of the segment 56b. The segment 56b' may be colored for example, yellow or any other color contrasting to the color of the segments 56a and 56b. Along the outer margin of the band segments 56a, 56b and 56c is a scale 58 with scale markings and indicia indicating various values of emission current flow indicated by the position of a meter movement pointer 59 movable over the face 56 of the meter.

To initially energize the circuit shown in FIG. 1, a master on-off manually operable switch 61 may be provided on the housing 1a which switch when closed feeds power from the outlet plug conductors 19 and 20 to the DC voltage source 34 and the filament source 16.

To make an emission test of the cathode ray tube 2, initially the wiper 30a of the function switch 30 is moved to the stationary SET contact 30c which couples the output of the potentiometer 31 to all of the control electrodes 8a, 8b and 8c. The filament voltage adjusting control 16a is rotated until the voltmeter 16b indicates the presence of a proper filament voltage, and the control electrode potentiometer is adjusted to provide the proper control electrode voltage on voltmeter 36 for the spot cutoff level adjustment operation (which voltage is commonly minus 50 volts).

The various chassis ground and cathode connected switch means 26a, 26b and 26c are rendered operative in a rapidly repeating sequence at a rate preferably occurring as much as 20 times per second. The stepped voltage waveform shown in FIG. 3i is fed to the voltage regulator circuit 54 in synchronism with the sequential closing of the switch means 26a, 26b and 26c. Next, the control 46 of the proportional circuit 45 is adjusted to a given reference position which maximizes the duration of the pulses P5 controlling the closing of the common switch means 27. A maximum duration of these pulses is, of course, no greater than the time segments t1, t2 and t3 of FIG. 3a.

The accelerator voltage adjusting potentiometers 57a, 57b and 57c are then adjusted so that the pointers 59 on the various current meters 25a, 25b and 25c are located slightly above the zero marker on the scale 57, such as opposite the first division marker 57a, so that the emission generated by the various electron guns are near the spot cutoff level.

The wiper 30a of the function control switch 30 is then moved to the stationary TEST contact 30d which applies chassis ground to the various control electrodes. This causes an appreciable emission of the various electron guns, if the emission capabilities of the electron guns are satisfactory. If any of the pointers 59 of the meters 25a, 25b or 25c is located in the BAD band segment 56a, this indicates poor emission and a rejuvenation operation well known in the art can be carried out to see if the electron gun involved can be rejuvenated.

If all of the electron guns show a satisfactory emission, the manually operable control 46 of the proportional circuit 45 is adjusted to decrease proportionately the emission of the various electron guns to a point where the pointer 59 associated with the electron gun having maximum emission is in alignment with a marker line 56c shown in FIG. 2 opposite the scale marker 58b indicating an emission current of 0.75 milliamps. If a pointer 59 of any of the other meters then falls below the TRACKING GOOD segment 56b, that is below the marker 58c on scale 58 indicating a current of 0.5 milliamps in FIG. 2, this means that the acceptable 1½ to 1 ratio of the emission between the highest and lowest emitting electron guns is not present.

Figure 4:
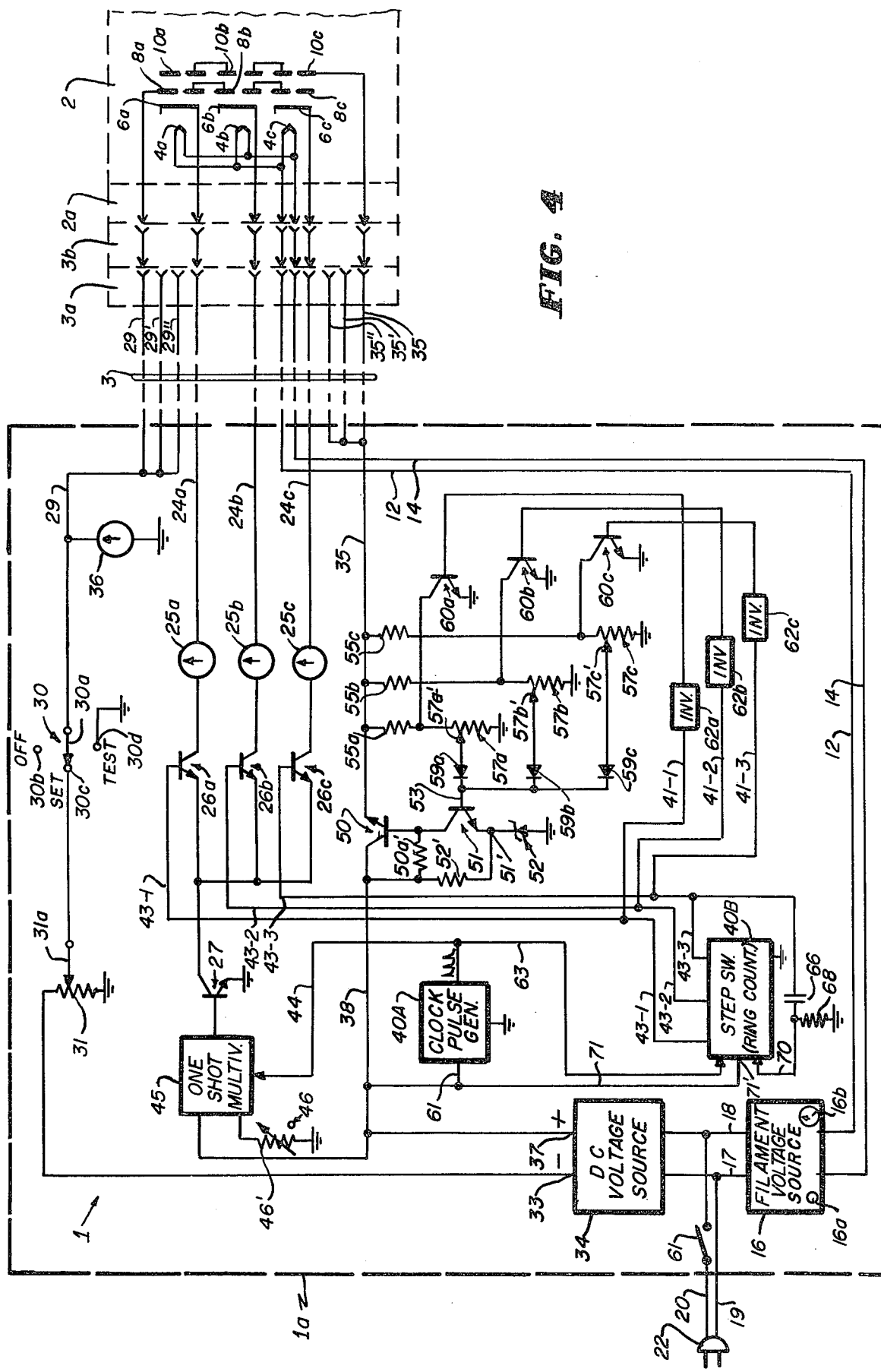
FIG. 4 is a view of the emission testing circuit of FIG. 1 with the synchronizing circuit shown as a single block in FIG. 1 expanded into exemplary functional components and the accelerator voltage adjusting circuit shown partly in block form in FIG. 1 shown in exemplary circuit form.

While the specific circuit details of the various component parts of the circuit FIG. 1 may vary widely, reference shall now be made to FIG. 4 which shows additional details of the synchronizing circuit 40 and the voltage regulator circuit. As shown in FIG. 3, the synchronizing circuit 40 may include a clock pulse generator 40A which may be energized by a conductor 61 extending from the positive bus 38. As previously indicated, the output of the clock pulse generator 40A shown in FIG. 3a is fed by a line 44 to the proportional control circuit 45 which is illustrated as a one-shot multivibrator. The manually operable control 46 of the proportional control circuit 45 is shown varying the value of a potentiometer 46' circuit thereof (not shown) which varies the time constant of a capacitor charge circuit for controlling the duration of the pulse output of the one-shot multivibrator. The output of the clock pulse generator 40A is also fed by conductor 63 to a suitable timing pulse generator circuit which may be a step switch means 40B which could be a mechanical stepping switch, or more preferably an electronic step switch, like a self resetting ring counter. A ring counter may comprise a series of cascaded bistable circuits or stages which have outputs to which the timing lines 43-1, 43-2 and 43-3 are respectively connected. Each of these stages has an output which is either a relatively high voltage of a given polarity or a zero or ground potential voltage, and all stages but one at any given instant provides one or the other of these two possible output conditions. As each timing pulse is fed to such a ring counter, the stage which has a distinctively different output condition is reset to the other output and the next stage is set to the distinctively different output condition. A reset circuit comprising a differentiating network of a capacitor 66 and resistor 68 is shown connected to an input 70 of the first stage of the ring counter. Also, a DC input line 71 is shown connecting positive bus 38 to the B plus input terminal 71' of the ring counter. The counter thus resets itself every three clock pulses fed to the input thereof, so that the clock pulses result in the generation of the pulses P1, P2 and P3 shown in FIGS. 3b, 3c and 3d, where the distinctively different output is a positive voltage like that shown for pulses P1, P2 or P3.

FIG. 4 shows timing lines 43-1, 43-2 and 43-3 respectively extending to the base electrodes of NPN transistors 26a, 26b and 26c constituting the aforementioned correspondingly numbered switch means. The collector electrodes of the transistors 26a, 26b and 26c, respectively are connected to the current meters 25a, 25b and 25c and the emitter electrodes thereof are shown connected to the emitter electrode of an NPN transistor 27 constituting the aforesaid switch means 27 whose emitter is connected to chassis ground and whose base electrode is connected to the output of the aforementioned one-shot multivibrator 45.

FIG. 4 shows an exemplary series-type voltage regulator circuit for regulating the voltage fed to the conductor 35 extending to the accelerator electrodes 10a, 10b and 10c of the cathode ray tube 2. As there shown, voltage varying means 50 in FIG. 1 is shown as an NPN transistor 50 whose conduction is controlled by an NPN control transistor 51 whose collector is connected to the base of transistor 50 and whose emitter is connected to the cathode of a Zener diode 52 whose anode is connected to chassis ground. A voltage-dropping resistor 52' extends between the cathode of the Zener diode 52 and the positive bus 38 so a fixed reference voltage is established at the juncture between the resistor 52' and the Zener diode 52. A resistor 50' extends between the base of transistor 50 and bus 38. The base of the control transistor 51 extends to the common outputs of the isolating rectifiers 59a, 59b and 59c.

The aforementioned switch means 60a, 60b and 60c are shown in FIG. 4 as NPN transistors 60a, 60b and 60c. The emitters of these transistors are connected to chassis ground, and the collectors thereof are connected respectively to the juncture between resistors 55a, 55b and 55c and the potentiometers 57a, 57b and 57c. The bases of the transistors 60a, 60b and 60c are respectively connected to the outputs of the aforementioned inverters 62a, 62b and 62c.

It can be seen that as a wiper 57a', 57b' or 57c' of any of the potentiometers 57a, 57b or 57c is adjusted so that the wiper is moved toward the output conductor 35, during the time that the potentiometer involved is effective in coupling a voltage through the associated isolating diode the voltage on the base of control transistor 51 will become more positive, causing the collector current of the control transistor 51 to increase, thereby by-passing more of the drive current from the transistor 50. The transistor 50 will then act as a higher impedance, dropping more voltage thereacross and dropping the voltage on the conductor 35 during the time segment t1, t2 or t3 involved. As the wiper on the potentiometer is moved closer to chassis ground, the inverse of the operation of the regulator circuit will occur. The wipers of the various potentiometers thus set a control point for the output of the voltage regulator circuit, which will operate in a direction to stabilize the voltage on the conductor 35 due to increases or decreases of voltage caused by variations in the output of the main DC voltage source 34 or an increase in emission current flow through the voltage regulator circuit.

It is apparent that the present invention can provide simultaneous indications of emission current flow for all the electron guns of a color cathode ray tube of the in-line or other types and in a manner and under conditions which greatly reduce the current requirements of the regulated voltage source.

It should be understood that numerous modifications may be made in the most preferred forms of the invention described without deviating from the broader aspects of the invention.

We claim:

1. In a circuit for testing the emission of the electron guns of a color cathode ray tube and including heater filament, cathode, control and accelerator electrode connecting terminals to be connected respectively to the heater filament, cathode, control and accelerator electrodes of the respective electron guns of a color cathode ray tube, a source of heater current to be continuously connected to said heater filament connecting terminals for continuously energizing the heater filaments of the electron guns of the cathode ray tube under test, and voltage source means to be connected between the cathode and one of the other electrodes of each electron gun for causing electron emission which is an indication of the electron emitting capabilities thereof, the improvement comprising separate emission indicating means for each electron gun of the cathode ray tube to be tested, each emission indicating means providing an indication as to whether or not the current flow between the cathode and said other electrode of the associated electron gun is at an adequate level, and switching means for sequentially connecting said voltage source means and emission indicating means to said electron gun electrode connecting terminals for cyclically establishing in sequence the flow of emission current between the cathode and said other electrodes of said various electron guns, whereby emission current flow occurs in only one electron gun at any given time segment of each switching cycle, while said emission indicating means simultaneously indic ᵣ the emission produced by the electron guns.

2. The color cathode ray tube emission testing circuit of claim 1 wherein said voltage source means includes a regulated source of voltage where the output thereof is maintained substantially constant as the current flow therefrom increases from near zero to an average level occurring during said sequential operation of said electron guns, and wherein the output thereof would materially reduce in value if current flow therefrom would increase to an order of magnitude of three time said average level.

3. The color cathode ray tube emission testing circuit of claim 1 wherein said voltage source means includes separately manually adjustable means providing a selection of output voltages to be respectively coupled to its commonly connected electrodes of an "in-line" or other type of color cathode ray tube, said switching means effecting the sequential coupling of said output voltages respectively to said electrode connecting terminals to be connected to the commonly connected electrodes of said cathode ray tube and the coupling of said cathode electrode connecting terminals to said voltage source means in synchronism with the coupling of the output voltage to the associated therewith to the commonly connected electrodes.

4. The color cathode ray tube emission testing circuit of claim 1 wherein said indicating means indicate average current flow therethrough and said switching means for sequentially connecting said voltage source means and emission indicating means to said electron gun electrode connecting terminals cyclically establishing in rapid firing sequence recurring many time per second the flow of emission current between the cathode and accelerator electrodes of said various electron guns.

5. The color cathode ray tube emission testing circuit of claim 3 wherein said voltage source means includes a regulated source of voltage where the output thereof is maintained substantially constant as the current flow therefrom increases from near zero to an average level occurring during said sequential operation of said electron guns, and wherein the output thereof would materially reduce in value if current flow therefrom would increase to an order of magnitude of 3 times said average level.

6. The color cathode ray tube emission testing circuit of claim 1 wherein said voltage source means includes separately manually adjustable means providing a selection of output voltages with respect to a reference potential point to be respectively coupled to the commonly connected electrodes of an "in-line" or other type of color cathode ray tube, said switching means effecting the sequential coupling of said output voltages respectively to said electrode connecting terminals to be connected to the commonly connected electrodes of said cathode ray tube and the coupling of said cathode electrode connecting terminals to said reference potential point in synchronism with the coupling of the output voltage to be associated therewith to the commonly connected electrodes.

7. The color cathode ray tube emission testing circuit of claim 1 wherein said switching means sequentially connects said voltage source means and emission indicating means in sequence between the accelerator and cathode electrode connecting terminals associated with said electron guns.

8. The color cathode ray tube emission testing circuit of claim 3 wherein said switching means couples said voltage source means and indicating means sequentially between the accelerator and cathode electrode connecting terminals associated with said electron guns.

9. The color cathode ray tube emission testing circuit of claim 8 provided with a source of adjustable negative voltage coupled between said control and cathode connecting terminals and means for selectively removing said adjustable negative voltage from said cathode connecting and control electrode terminals and connecting said cathode and control electrode connecting terminals to a reference voltage which produces a relatively high intensity cathode emission in a normal operating electron gun.

10. In a circuit for testing the emission of the electron guns of a color cathode ray tube and including heater filament, cathode, control and accelerator electrode connecting terminals to be connected respectively to the heater filament, cathode, control and accelerator electrodes of the respective electron guns of a color cathode ray tube, a source of heater current to be continuously connected to said heater filament connecting terminals for continuously energizing the heater filaments of the electron guns of the cathode ray tube under test, and voltage source means to be connected between the cathode and one of the other electrodes of each electron gun for causing electron emission which is an indication of the electron emitting capabilities thereof, the improvement comprising separate emission indicating means for each electron gun of the cathode ray tube to be tested, each emission indicating means providing an indication as to whether or not the current flow between the cathode and said other electrode of the associated electron gun is at an adequate level; said voltage source means including a main source of unregulated voltage having output terminals at which a DC voltage appears which can vary appreciably; and a voltage regulator circuit comprising voltage varying means to be connected in series between one of said output terminals and said cathode and said other electrode connecting terminals, a source of reference voltage, adjusting means whose input is coupled to the output of said voltage varying means for providing an output representing a selected proportion of the input voltage thereto, control means responsive to the output of a voltage adjusting means coupled with said source of reference voltage for operating said voltage varying means to provide at the output thereof a voltage which is a function of the difference between the output voltage of said voltage adjusting means and said source of reference voltage for stabilizing the adjusted voltage at the output of said voltage varying means with fluctuations of voltage or current from said main source of unregulated voltage, and switching means for repeatedly sequentially coupling a different one of the outputs of said adjusting means to said control means in synchronism with the repeatedly sequential connection of the regulated output of said voltage regulator circuit between said cathode and said other electrode connecting terminals.

11. The color cathode ray tube emission testing circuit of claim 10 wherein said switching means couples said regulated output of said voltage varying means sequentially between the accelerator and cathode electrode connecting terminals associated with said electron guns.

12. The color cathode ray tube emission testing circuit of claim 11 provided with a source of adjustable negative voltage coupled between said control and cathode connecting terminals, and means for selectively removing said adjustable negative voltage for said cathode and control grid connecting terminals and connecting the said cathode and control electrode connecting terminals to a reference voltage which produces a relatively high intensity cathode emission in a normal operating electron gun.

* * * * *